US012512296B2

(12) United States Patent
Schmaunz et al.

(10) Patent No.: US 12,512,296 B2
(45) Date of Patent: Dec. 30, 2025

(54) METHOD OF PROCESSING A SAMPLE, PARTICLE BEAM SYSTEM, AND COMPUTER PROGRAM PRODUCT

(71) Applicant: Carl Zeiss Microscopy GmbH, Jena (DE)

(72) Inventors: Andreas Schmaunz, Oberkochen (DE); Gero Walter, Westhausen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 350 days.

(21) Appl. No.: 18/353,966

(22) Filed: Jul. 18, 2023

(65) Prior Publication Data

US 2024/0029996 A1 Jan. 25, 2024

(30) Foreign Application Priority Data

Jul. 19, 2022 (DE) ......................... 102022118006.9

(51) Int. Cl.
*H01J 37/305* (2006.01)
*H01J 37/244* (2006.01)

(52) U.S. Cl.
CPC ........ *H01J 37/3056* (2013.01); *H01J 37/244* (2013.01); *H01J 2237/006* (2013.01); *H01J 2237/317* (2013.01)

(58) Field of Classification Search
CPC ................. H01J 37/5056; H01J 37/244; H01J 2237/006; H01J 2237/317
See application file for complete search history.

(56) References Cited

U.S. PATENT DOCUMENTS

| | | | |
|---|---|---|---|
| 5,656,811 | A | 8/1997 | Itoh et al. |
| 2005/0103272 | A1 | 5/2005 | Koops et al. |
| 2006/0022136 | A1 | 2/2006 | Moore |
| 2009/0152460 | A1 | 6/2009 | Buhler et al. |
| 2009/0230299 | A1 | 9/2009 | Shichi et al. |

(Continued)

FOREIGN PATENT DOCUMENTS

| | | | | | |
|---|---|---|---|---|---|
| CN | 110176379 | B | * | 4/2024 | .......... H01J 37/3005 |
| CN | 119902411 | A | * | 4/2025 | ............... G03F 1/74 |
| DE | 102 08 043 | A1 | | 9/2003 | |

(Continued)

OTHER PUBLICATIONS

German Office Action, with translation thereof, for corresponding DE application No. 10 2022 118 006.9 dated Mar. 28, 2023.

*Primary Examiner* — David P Porta
(74) *Attorney, Agent, or Firm* — Fish & Richardson P.C.

(57) ABSTRACT

While the sample is in a vacuum chamber of the particle beam system, a method comprises: processing the sample via an automatic supply in accordance with a process gas supply setting of at least one of a plurality of different process gases to the sample via a process gas supply device and via an activation of the supplied, at least one process gas by a particle beam of charged particles or a laser beam; measuring a property of the processed sample using a measuring device; modifying the process gas supply setting so that there is a change in a ratio of the quantities of the process gases to be supplied, on the basis of a measurement result obtained by the measurement; and continuing the processing of the sample using the modified process gas supply setting.

20 Claims, 5 Drawing Sheets

(56) References Cited

U.S. PATENT DOCUMENTS

| | | | |
|---|---|---|---|
| 2010/0200750 | A1 | 8/2010 | Mantz et al. |
| 2013/0187064 | A1 | 7/2013 | Zeile et al. |

FOREIGN PATENT DOCUMENTS

| | | | |
|---|---|---|---|
| DE | 10 2007 054 074 | A1 | 5/2009 |
| DE | 10 2012 001 267 | A1 | 7/2013 |
| EP | 0 687 897 | A1 | 12/1995 |
| EP | 2 216 798 | A2 | 8/2010 |
| WO | WO 2006/025968 | A2 | 3/2006 |

* cited by examiner

METHOD OF PROCESSING A SAMPLE, PARTICLE BEAM SYSTEM, AND COMPUTER PROGRAM PRODUCT

CROSS-REFERENCE TO RELATED APPLICATION

This application claims benefit under 35 U.S.C. § 119 to German Application No. 10 2022 118 006.9, filed Jul. 19, 2022. The entire disclosure of this application is incorporated by reference herein.

FIELD

The disclosure relates to a particle beam system, for example an electron beam system or an ion beam system or a combination thereof, and to a method of processing a sample in such a particle beam system using a mixture of a plurality of different process gases, and to a computer program product.

BACKGROUND

Methods and systems are known in which an activation beam, for example a beam of charged particles or a laser beam, is used to process a sample by virtue of the activation beam being directed at a selectable processing location on the sample, in order to deposit material on the sample or remove material from the sample there. To deposit material on the sample, a process gas containing a precursor of the material is supplied to the processing location and activated there by the activation beam so that there is a deposition of the material on the processing location or in the vicinity thereof. To remove material from the sample, a process gas is supplied to the processing location and activated there by the activation beam so that a part of the sample is detached from the sample, and thus removed from the sample, by the chemical interaction between the activated process gas and the sample.

Examples of such systems are known, for example, from DE 102 08 043 A1 and DE 10 2012 001 267 A1.

Although certain known systems allow the controlled sequential supply of a plurality of process gases to the processing location on the sample and the processing of the sample by the activated process gas, it is generally now possible within the scope of the processing process of determining whether or not a process gas processing setting, which defines the processing process, in fact enables desired processing.

SUMMARY

The present disclosure seeks to provide methods of processing a sample in a particle beam system and particle beam systems that achieve desired processing on a sample.

A first aspect of the disclosure relates to a method of processing a sample in a particle beam system. The particle beam system comprises: a vacuum chamber; a first particle beam column which is configured to produce a first particle beam of charged particles and direct the latter to a first work region within the vacuum chamber; a measuring device which comprises at least one first detector, the first detector being configured to detect electrically charged particles emanating from the first work region; a process gas supply device which is configured to guide a plurality of different process gases to the first work region in accordance with a process gas supply setting; and a controller which is configured to control the first particle beam column and the process gas supply device and to receive and process a detection signal from the first detector. The method comprises the steps of: processing the sample in the first work region by way of an automatic supply in accordance with the process gas supply setting of at least one process gas of the process gases to the sample via the process gas supply device and by way of an activation in accordance with a process gas activation setting of the supplied, at least one process gas by the first particle beam; measuring a property of the processed sample in the vacuum chamber using the measuring device, the property of the sample changing in a manner dependent on the processing of the sample; modifying the process gas supply setting in such a way that there is a change in a ratio of the quantities of the process gases to be supplied, on the basis of a measurement result obtained by the measurement; and continuing the processing of the sample in the first work region using the modified process gas supply setting.

A second aspect of the disclosure relates to a particle beam system for processing a sample. The particle beam system comprises: a vacuum chamber; a first particle beam column which is configured to produce a first particle beam of charged particles and direct the latter to a first work region within the vacuum chamber; a measuring device which comprises at least one first detector, the first detector being configured to detect electrically charged particles emanating from the first work region; a process gas supply device which is configured to guide a plurality of different process gases to the first work region in accordance with a process gas supply setting; a controller which is configured to control the first particle beam column and the process gas supply device and to receive and process a detection signal from the first detector; the controller being further configured to control the process gas supply device in accordance with the process gas supply setting so that at least one process gas of the plurality of different process gases is supplied to the sample in the first work region via the process gas supply device; the controller being further configured to control the first particle beam column in accordance with a process gas activation setting so that the at least one process gas supplied to the sample is activated by the particle beam, with the result that the sample is processed in the first work region; the measuring device being configured to measure a property of the sample in the vacuum chamber, the property of the sample changing in a manner dependent on the processing of the sample; the controller being further configured to modify the process gas supply setting so that a ratio of the quantities of the process gases to be supplied changes; and the controller being further configured to process the sample in the first work region in accordance with the modified process gas supply setting.

A third aspect of the disclosure relates to a method of processing a sample in a particle beam system. The particle beam system comprises: a vacuum chamber; a first particle beam column which is configured to produce a first particle beam of charged particles and direct the latter to a first work region within the vacuum chamber; a measuring device which comprises at least one first detector, the first detector being configured to detect electrically charged particles emanating from the first work region; a laser which is configured to produce a laser beam and direct the latter to a second work region within the vacuum chamber; a process gas supply device which is configured to guide a plurality of different process gases to the second work region in accordance with a process gas supply setting; and a controller which is configured to control the first particle beam column, the laser, and the process gas supply device and to receive and process a detection signal from the first detector. The method comprises the steps of: processing the sample in the second work region by way of an automatic supply in accordance with the process gas supply setting of at least one process gas of the process gases to the sample via the process gas supply device and by way of an activation in accordance with a process gas activation setting of the supplied, at least one process gas by the laser beam; measuring a property of the processed sample in the vacuum chamber using the measuring device, the property of the sample changing in a manner dependent on the processing of the sample; modifying the process gas supply setting in such a way that there is a change in a ratio of the quantities of the process gases to be supplied, on the basis of a measurement result obtained by the measurement; and continuing the processing of the sample in the second work region using the modified process gas supply setting.

A fourth aspect of the disclosure relates to a particle beam system for processing a sample. The particle beam system comprises: a vacuum chamber; a first particle beam column which is configured to produce a first particle beam of charged particles and direct the latter to a first work region within the vacuum chamber; a measuring device which comprises at least one first detector, the first detector being configured to detect electrically charged particles emanating from the first work region; a laser which is configured to produce a laser beam and direct the latter to a second work region within the vacuum chamber; a process gas supply device which is configured to guide a plurality of different process gases to the second work region in accordance with a process gas supply setting; a controller which is configured to control the first particle beam column, the laser, and the process gas supply device and to receive and process a detection signal from the first detector; the controller being configured to control the process gas supply device in accordance with the process gas supply setting so that at least one process gas of the plurality of different process gases is supplied to the sample in the second work region via the process gas supply device; the controller being further configured to control the laser in accordance with a process gas activation setting so that the at least one process gas supplied to the sample is activated by the laser beam, with the result that the sample is processed in the second work region; the measuring device being configured to measure a property of the sample in the vacuum chamber, the property of the sample changing in a manner dependent on the processing of the sample; the controller being further configured to modify the process gas supply setting so that a ratio of the quantities of the process gases to be supplied changes; and the controller being further configured to process the sample in the second work region in accordance with the modified process gas supply setting.

A fifth aspect of the disclosure relates to a computer program product comprising computer-executable instructions which, upon execution on a computer, for example a controller of a particle beam system, cause the controller to carry out one of the methods as described herein. By way of example, the computer program product is a data medium, for example a CD (compact disk), DVD (digital versatile disk), or any other storage medium, on which the instructions are stored in a computer-executable form. Alternatively, the computer program product can be a computer-readable file in the form of a specific storage of state of a data storage. The file can be stored in a storage to which the controller has direct access or in a remote storage. The file can be transferred via a communications link (for example the Internet) from the remote storage to the storage to which the controller has direct access.

Depending on type and composition, the activated process gases may cause material from the supplied process gases to be deposited on the sample. Depending on the type and composition, the activated process gases may alternatively cause material to be removed from the sample.

The progress of the processing can be monitored while the processing is carried out (i.e., while material is deposited on the sample or while material is removed from the sample) by measuring a property of the processed sample, and the process gas supply setting, which defines parameters of the supply of the process gases, for example a ratio of the quantities of the process gases to be supplied, is adapted during the processing on the basis of the measured property. As a result, it is possible during the processing with the process gases to adapt the parameters of the processing with process gases on the basis of the current state of the sample. This makes it possible to process the sample in such a way that desired processing with the process gases is actually achieved on the sample.

BRIEF DESCRIPTION OF THE DRAWINGS

Embodiments of the disclosure are explained in more detail hereinbelow with reference to figures, in which.

DETAILED DESCRIPTION

Figure 1:
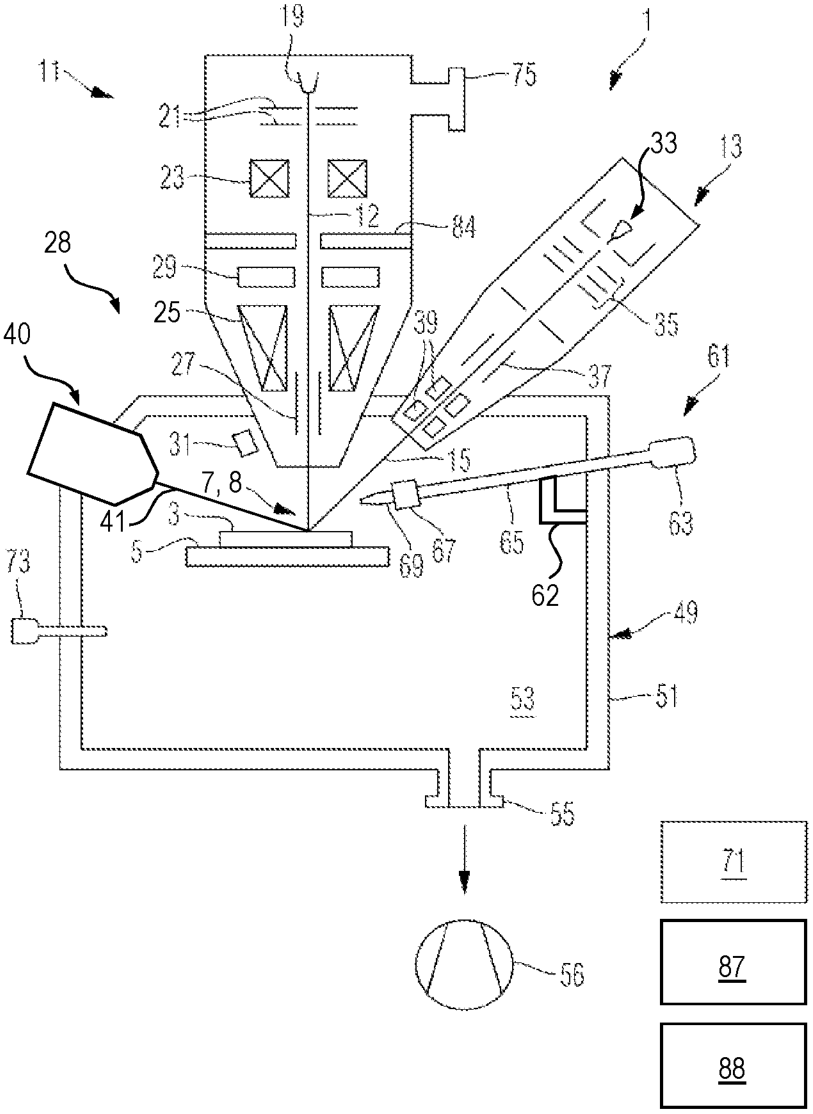
FIG. 1 shows a schematic illustration of a particle beam system.

FIG. 1 shows a schematic illustration of a particle beam system 1 for processing a sample 3 using a plurality of different process gases, which are activated by using a particle beam 12, 15 and/or a laser beam 41. The particle beam system 1 serves to process the sample 3 which is attached to a sample holder 5.

In the illustrated exemplary embodiment, the particle beam system 1 comprises an electron beam column 11, which is able to produce an electron beam 12 and which operates in a work region of the electron beam column 11. The work region of the electron beam column 11 refers to the spatial region into which the electron beam column 11 is able to direct the electron beam 12.

In the illustrated exemplary embodiment, the particle beam system 1 further comprises an ion beam column 13, which is able to produce an ion beam 15 and which operates in a work region of the ion beam column 13. The work region of the ion beam column 13 refers to the spatial region into which the ion beam column 13 is able to direct the ion beam 15.

As shown in FIG. 1, the electron beam column 11 and the ion beam column 13 operate in a common work region. The common work region of the electron beam column 11 and ion beam column 13 refers to the spatial region in which the work region of the electron beam column 11 and the work region of the ion beam column 13 overlap. The common work region of the electron beam column 11 and ion beam column 13 is referred to as a first work region 7 hereinbelow.

However, the particle beam system 1 may comprise only one of the two particle beam columns 11 and 13. Should the particle beam system 1 comprise only the electron beam column 11, then the first work region 7 refers to the work region of the electron beam column 11. Should the particle beam system 1 comprise only the ion beam column 13, then the first work region 7 refers to the work region of the ion beam column 13.

The electron beam 12 produced by the electron beam column 11 and the ion beam 15 produced by the ion beam column 13 each are an example of an activation beam suitable for activating process gas. However, the activation beam need not necessarily be a beam of charged particles. By way of example, the activation beam may be the laser beam 41, which is produced by a laser 40.

The laser 40 operates in a work region of the laser 40. The work region of the laser 40 refers to the spatial region into which the laser 40 is able to direct the laser beam 41. The work region of the laser 40 is referred to as a second work region 8 hereinbelow.

As shown in FIG. 1, the electron beam column 11, the ion beam column 13, and the laser 40 operate in a common work region, which refers to the spatial region in which the work region of the electron beam column 11, the work region of the ion beam column 13, and the work region of the laser 40 overlap.

The sample holder 5 can be configured so that it can displace the sample 3 in three spatial directions so as to be able to process a plurality of different processing locations on the surface of the sample 3 using the activation beams 12, 15, 41. Further, the sample holder 5 may be configured to modify an orientation of the sample 3 relative to the activation beams 12, 15, 41 (for example, by rotation, tilting, etc.).

The electron beam column 11 comprises an electron source 19 with electrodes 21 for extracting an electron beam and accelerating the same, a condenser lens system 23 for shaping the electron beam 12, and an objective lens 25 for focusing the electron beam 12 into the first work region 7. Beam deflectors 27 are provided for the purpose of varying the location of incidence of the electron beam 12 on the sample 3 and, for example, scanning a region of the sample surface.

The ion beam column 13 comprises an ion source 33 and electrodes 35 for shaping and accelerating the ion beam 15, and beam deflectors 37 and focusing coils or focusing electrodes 39 (objective) for focusing the ion beam 15 in the first work region 7 and for scanning the ion beam there over a region of the sample 3.

The particle beam system 1 further comprises a vacuum chamber 49 having a vacuum-tight wall 51 which surrounds the first work region 7 and the second work region 8 such that the first work region 7 and the second work region 8 are arranged in the vacuum chamber 49 (in a vacuum volume 53 defined by the vacuum chamber 49). The vacuum chamber 49 is evacuated by way of a pump nozzle 55, to which a vacuum pump 56 is connected. The ends of the particle beam columns 11 and 13 facing the first work region 7 project into the vacuum space 53 and are sealed vis-à-vis the wall 51. The particle beam columns 11 and 13 may have separate connectors 75, which are connected to the same or separate vacuum pumps, in order to pump out the interiors thereof.

For example, the laser 40 can comprise a laser beam source and a laser beam deflector for directing the laser beam 41 into the second work region 8 and for scanning the laser beam there over a region of the sample 3. The laser 40 may be arranged, in full or in part, in the vacuum chamber 49. Alternatively, the laser 40 may also be arranged fully outside of the vacuum chamber 49 and the laser beam 41 is then guided into the vacuum chamber 49 via a window, a fiber, or the like.

Figure 2:
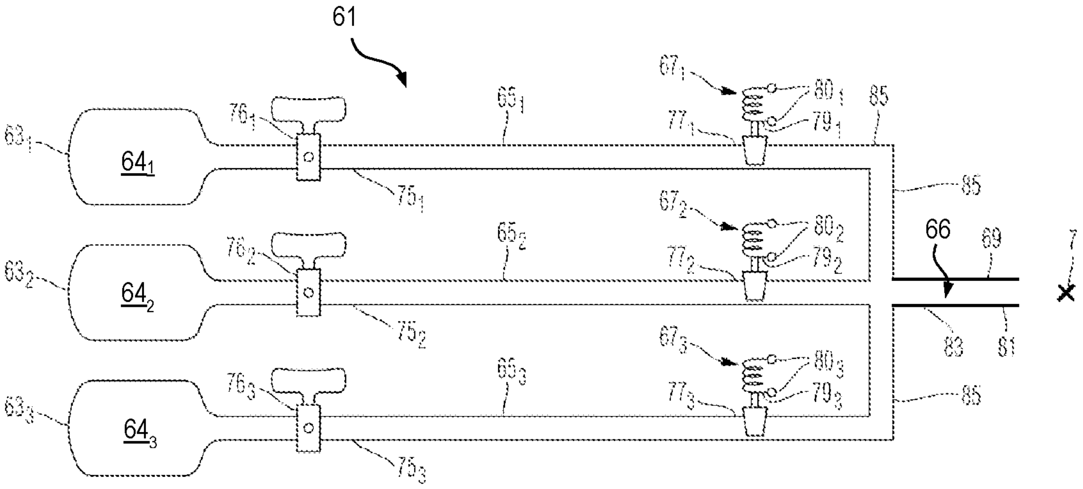
FIG. 2 shows a schematic illustration of a process gas supply device.

The particle beam system 1 further comprises a process gas supply device 61, which is depicted schematically in FIG. 1. FIG. 2 shows the process gas supply device 61 in detail. The process gas supply device 61 serves to guide a plurality of different process gases $\mathbf{64}_1$, $\mathbf{64}_2$, $\mathbf{64}_3$ into a work region of the process gas supply device 61, either individually or as a process gas mixture 66 of the process gases $\mathbf{64}_1$, $\mathbf{64}_2$, $\mathbf{64}_3$. If the intention is for the process gases $\mathbf{64}_1$, $\mathbf{64}_2$, $\mathbf{64}_3$ or the process gas mixture 66 to be activated by the electron beam 12 or the ion beam 15, then the process gas supply device 61 is configured to supply the process gases $\mathbf{64}_1$, $\mathbf{64}_2$, $\mathbf{64}_3$ or the process gas mixture 66 to the first work region 7. In this case, the work region of the process gas supply device 61 and the first work region 7 overlap. On the other hand, if the intention is for the process gases $\mathbf{64}_1$, $\mathbf{64}_2$, $\mathbf{64}_3$ or the process gas mixture 66 to be activated by the laser beam 41, then the process gas supply device 61 is configured to supply the process gases $\mathbf{64}_1$, $\mathbf{64}_2$, $\mathbf{64}_3$ or the process gas mixture 66 to the second work region 8. In this case, the work region of the process gas supply device 61 and the second work region 8 overlap.

The particle beam system 1 may comprise a positioning apparatus 62 for positioning the process gas supply device 61. The positioning apparatus 62 is configured to displace the work region of the process gas supply device 61. For example, the process gas supply device 61 can optionally set the work region of the process gas supply device 61 to the first work region 7 or the second work region 8.

The particle beam system 1 furthermore comprises a controller 71, which controls the particle beam system 1. For example, the controller controls the particle beam columns 11, 13, the laser 40, and the process gas supply device 61.

The process gas supply device 61 is described hereinbelow with reference to FIG. 1 and FIG. 2. FIG. 1 schematically illustrates a gas reservoir 63 (representing all gas reservoirs $\mathbf{63}_1$, $\mathbf{63}_2$, $\mathbf{63}_3$), which is arranged outside of the vacuum chamber 49, a gas line 65 (representing all gas lines $\mathbf{65}_1$, $\mathbf{65}_2$, $\mathbf{65}_3$), which passes through the wall 51 of the vacuum chamber 49, a valve 67 (representing all valves $\mathbf{67}_1$, $\mathbf{67}_2$, $\mathbf{67}_3$), and a pipe 69, the end of which faces the work region of the process gas supply device 61. However, it is also possible to design the process gas supply device 61 in such a way that the gas reservoir 63 is arranged within the vacuum chamber 49, with the result that it is not necessary to guide the gas line 65 through the wall 51 of the vacuum chamber 49 and there is no need for an associated vacuum seal.

The valve 67 of the process gas supply device 61 is controlled by the controller 71 in order to allow a process gas contained in the reservoir 63 to pass into the work region of the process gas supply device 61. There, the process gas can be activated by the particle beam 12, 15 and/or the laser beam 41 in order to process the sample 3. The controller 71 can further control the beam deflectors 27 and 37 in order to selectively direct the particle beams 12 and/or 15 to different locations on the surface of the sample 3, for the purpose of varying the processing location at which the supplied process gas is activated.

In the illustration of FIG. 2, the process gas supply device 61 comprises three reservoirs 63$_1$, 63$_2$, 63$_3$ for up to three different process gases. The first end 75$_1$, 75$_2$, and 75$_3$ of a gas line 65$_1$, 65$_2$, and 65$_3$, respectively, is connected to each of the reservoirs 63$_1$, 63$_2$, 63$_3$. In this case, each of the reservoirs may comprise a stop valve themselves or a respective stop valve 76$_1$, 76$_2$, 76$_3$ may be provided between the reservoirs 63$_1$, 63$_2$, 63$_3$ and the first ends 75$_1$, 75$_2$, 75$_3$ of the gas lines 65$_1$, 65$_2$ and 65$_3$, respectively, the stop valve being able to be opened manually or under controller 71 control in order to put the process gas supply device 61 into operation or being able to be closed to put the latter permanently out of operation.

Valves 67$_1$, 67$_2$, and 67$_3$ which are able to allow or block the passage of gas through the ends 77 of the gas lines 65 are connected to the second ends 77$_1$, 77$_2$, 77$_3$ of the gas lines opposite the first ends 75. In the illustrated example, the valves 67 are magnetic valves which each comprise a magnetic coil 79$_1$, 79$_2$ and 79$_3$, the connectors 80$_1$, 80$_2$, 80$_3$ of which are connected to the controller 71 such that the controller 71 can supply excitation currents to the coils, in order to optionally open or close the latter. As an alternative to the aforementioned configuration, in which each valve 67$_1$, 67$_2$ and 67$_3$ can adopt only two states, specifically completely open or completely closed, it is also possible to use valves which provide variable metering in each case. This means that a flow rate through the valve is adjustable in more than two levels, for example continuously.

The process gases 64$_1$, 64$_2$, 64$_3$ stored in the reservoirs 63$_1$, 63$_2$, 63$_3$ can be mixed in a pipe 69 to form a process gas mixture 66 by simultaneously opening a plurality of valves 67$_1$, 67$_2$, 67$_3$, and can be supplied to the work region of the process gas supply device 61 via the pipe 69, the first end 81 of which faces the work region of the process gas supply device 61. To this end, a second end 83 of the pipe 69 is connected to the valves 67$_1$, 67$_2$, and 67$_3$ via distributor lines 85.

Alternatively, the process gases 64$_1$, 64$_2$, 64$_3$ stored in the reservoirs 63$_1$, 63$_2$, 63$_3$ can be supplied to the work region of the process gas supply device 61 individually and successively via the pipe 69 by sequentially opening and closing only one of the valves 67$_1$, 67$_2$, 67$_3$ at a time. The supplied process gases mix in the work region of the process gas supply device 61.

Figure 3:
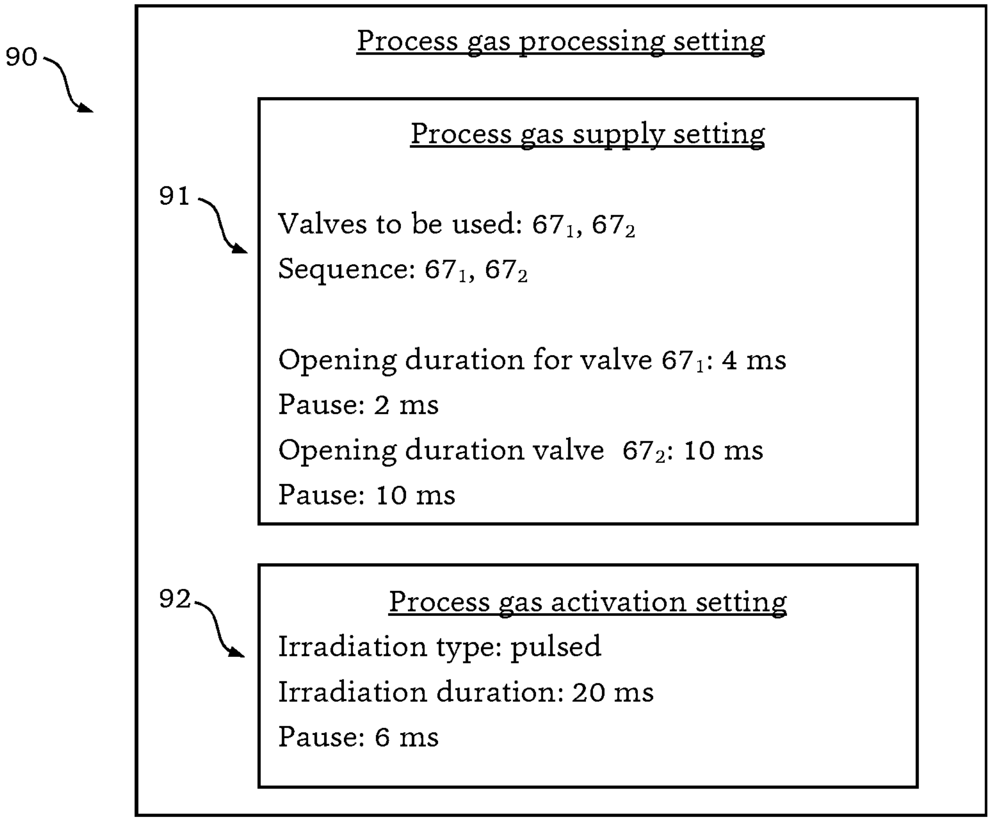
FIG. 3 shows an illustration of an exemplary process gas processing setting.

FIG. 3 shows an illustration of an exemplary process gas processing setting 90. The process gas processing setting 90 may be stored in a storage and may be read and modified by the controller 71. The process gas processing setting 90 comprises a process gas supply setting 91, which defines parameters of the process gas supply by the process gas supply device 61, and a process gas activation setting 92, which defines parameters of the process gas activation by the particle beam column 11, 13 (or by the laser 40). The controller 71 operates the process gas supply device 61 in accordance with the process gas supply setting 91. The controller 71 operates the particle beam column 11, 13 (or the laser 40) in accordance with the process gas activation setting 92. A specific example of the process gas processing setting 90 is explained with reference to FIG. 3.

In the specific example, the process gas supply setting 91 of the process gas processing setting 90 specifies that the valves 67$_1$ and 67$_2$ should be used; by contrast, the valve 67$_3$ should not be used. This means that use should be made of the process gases contained in the reservoirs 63$_1$ and 63$_2$. Accordingly, the controller 71 will open and close the valves 67$_1$ and 67$_2$ specified as to be used, in order to supply the process gases 64$_1$ and 64$_2$ contained in the reservoirs 63$_1$ and 63$_2$ to the work region of the process gas supply device 61.

In the specific example, the process gas supply setting 91 further specifies that the valves to be used should be used in the sequence of 67$_1$ and then 67$_2$, which is to say sequentially. In this mode of operation, the valves 67$_1$ and 67$_2$ to be used are opened and closed individually and successively in order to release the respective process gas. In the example shown, the valve 67$_1$ is opened first, to be precise for an opening duration of 4 ms as specified in the process gas supply setting 91. The valve 67$_1$ is closed once the opening duration has expired. Subsequently, both valves are closed for the duration of a pause specified in the process gas supply setting 91 (2 ms in this case). Subsequently, the valve 67$_2$ is opened, to be precise for an opening duration of 10 ms as specified in the process gas supply setting 91. The valve 67$_2$ is closed once the opening duration has expired. Subsequently, both valves are closed for the duration of a pause specified in the process gas supply setting 91 (10 ms in this case). Subsequently, this sequence is repeated. In this case, the process gases are mixed not in the process gas supply device 61 but in the work region of the process gas supply device 61.

The specific example only serves to explain an exemplary procedure of supplying at least one process gas of the plurality of process gases by way of the process gas supply device 61 in accordance with the process gas supply setting 91. Deviating from the example above, a plurality of process gases may be supplied simultaneously. To this end, the process gas mixture 66 is produced from a plurality of different process gases 64$_1$, 64$_2$, 64$_3$, the process gas mixture being a mixture of at least two process gases of the process gases in accordance with a mixing ratio defined in the process gas supply setting 91. Deviating from the example above, use could be made of a plurality of process gas supply devices 61 for the purpose of supplying at least two process gases of the process gases 64$_1$, 64$_2$, 64$_3$, with the parameters for the plurality of process gas supply devices 61 being comprised by the process gas supply setting 91 in this case. In this case, the process gases 64$_1$, 64$_2$, 64$_3$ are mixed not in the process gas supply devices 61 but in the work region of the process gas supply device 61.

Processing of the sample 3 is fundamentally fixed by the parameters defined in the process gas supply setting 91. Consequently, the quantity of a deposition from the respective process gas and the ratio of the quantities of the depositions from a plurality of process gases are explicitly or implicitly definable by way of the process gas supply setting 91. Consequently, the quantity and/or rate of a removal of material from the sample are or is explicitly or implicitly definable by way of the process gas supply setting 91.

In the specific example, the process gas activation setting 92 of the process gas processing setting 90 specifies that the activation of the process gases guided to the work region of the process gas supply device 61 through the valves 67$_1$ and 67$_2$ is intended to be activated by pulsed irradiation (irradiation type). Following an irradiation duration of 20 ms, during which the process gases situated in the work region of the process gas supply device 61 are activated simultaneously, the activation is interrupted for 6 ms (pause).

The specific example only serves to explain an exemplary procedure of the activation of the supplied, at least one process gas by the particle beam column 11, 13 (or the laser 40) in accordance with the process gas activation setting 92. Deviating from the example above, the activation can be carried out continuously (i.e., without interruptions). Deviating from the example above, the case of the sequential supply of at least two process gases of the process gases may provide for the respective process gas to be activated immediately, before another process gas is supplied. For example, the process gas supplied by the valve $67_1$ may be activated in the pause following the supply, and the process gas supplied by the valve $67_2$ may be activated in the pause following the supply.

Processing of the sample 3 is fundamentally fixed by the parameters defined in the process gas activation setting 92. Consequently, the quantity of a deposition from the respective process gas and the ratio of the quantities of the depositions from a plurality of process gases are explicitly or implicitly definable by way of the process gas activation setting 92. Consequently, the quantity and/or rate of a removal of material from the sample are or is explicitly or implicitly definable by way of the process gas activation setting 92.

With reference to FIG. 1 again, the particle beam system 1 further comprises a measuring device 28 which is configured to measure a property of the sample 3 in the vacuum chamber 49, with the property of the sample 3 changing in a manner dependent on the processing of the sample 3. More precisely, the measuring device 28 is configured to measure a current value of a property (for example, a current value of a temperature) of the sample 3, and the current value of the property changes on account of the processing of the sample 3 or on account of the measuring procedure. The measuring device 28 may comprise one or more detectors and may measure one or more properties of the sample 3 (i.e., current values of a plurality of properties of the sample 3). For example, the measuring device 28 may be configured to measure the property of the sample 3 in the first work region 7 and/or second work region 8.

In the example shown in FIG. 1, the measuring device 28 comprises a detector 29 which is arranged within the electron beam column 11. In the example shown in FIG. 1, the measuring device 28 also comprises a first element 31 from a group of elements (group of different detectors and manipulators) which is arranged within the vacuum chamber 49 (but outside of the electron beam column 11). In the example shown in FIG. 1, the measuring device 28 also comprises a second element 73 from the group of elements which is arranged (partly) outside of the vacuum chamber 49.

For example, the group of elements (group of different detectors and manipulators) comprises an EDX detector which is configured to measure x-ray radiation energy dispersively; a sensing device which is configured to exert a force on the sample 3 and measure the exerted force; a heater which is configured to heat the sample 3; a spectrometer for electromagnetic radiation; a light source which is configured to expose the sample 3; and a light detector which is configured to detect light emanating from the sample 3. The measuring device 28 may comprise other and/or additional detectors and manipulators.

By way of example, the detector 29 is configured to detect electrically charged particles and to output a corresponding detection signal to the controller 71. By way of example, the detector 29 may be configured to detect electrons produced or released by the interaction of the electron beam 12 with the sample 3. In conjunction with the beam deflectors 27, this allows an electron microscope image (SEM image) of a region of the sample 3 to be recorded. Alternatively, or in addition, the detector 29 may be configured to detect electromagnetic radiation, for example light (cathodoluminescence) or x-ray radiation.

By way of example, the detector 31 is an EDX detector. By way of example, the detector 73 is configured to measure a gas pressure in the vacuum space 53 and to output a corresponding detection signal to the controller 71.

The measuring device 28 may comprise what is known as an EDX detector, which is configured to measure x-ray radiation energy dispersively in order to conduct energy dispersive x-ray spectroscopy. An atomic composition of the (processed) sample 3 can be determined on the basis of a measurement with the EDX detector.

The measuring device 28 may comprise a resistance detector which is configured to detect an electrical resistance. An exemplary configuration of such a resistance detector is based on the principle of the four-point measurement. To this end, the resistance detector comprises four electrodes. Two of the four electrodes serve to excite an electric current between the two electrodes. Two other electrodes of the four serve to measure a voltage between the two other electrodes. The electrical resistance is determined from the measured voltage. To simplify contacting, conductor tracks to which the electrodes can be connected may be provided for on the sample. Alternatively, the electrodes can be brought into direct contact with the sample 3 by placement thereon.

The measuring device 28 may comprise a sensing device which is configured to exert force on the sample 3 and measure the exerted force.

The measuring device 28 may comprise a heater/cooler for heating and/or cooling the sample 3. As a result, it is possible to bring about a thermal expansion/contraction of the sample 3. The measuring device 28 may comprise a temperature detector which is configured to measure the temperature of the sample 3. On the basis of the measured temperature or a temperature profile and a detected thermal expansion/contraction, for example by way of an image analysis of an SEM image, it is possible to determine a thermal expansion of the sample 3.

The measuring device 28 may comprise a spectrometer which is configured to conduct a spectroscopic measurement (i.e., an energy-resolved or wavelength-resolved measurement) of electromagnetic radiation emanating from the sample 3.

The measuring device 28 may comprise a light source for exposing the sample 3 and a light detector for detecting light emanating from the sample 3. As a result, it is possible for example to measure an optical reflectivity, an optical transmissivity, or an optical absorption of the sample 3.

The measuring device 28 may comprise a mass spectrometer which is configured to resolve matter emanating from the sample 3 according to mass and/or according to a mass-to-charge ratio. For example, the mass spectrometer may be a secondary ion mass spectrometer.

The controller 71 is configured to modify the process gas processing setting 90 on the basis of a measurement result output by the measuring device 28. The controller 71 may be configured to automatically modify the process gas processing setting 90 on the basis of the measurement result. For example, the controller 71 is configured to process (analyze) the measurement result and modify the process gas processing setting 90 on the basis thereof.

For example, the controller 71 may be configured to conduct an image analysis on an SEM image or a plurality of SEM images or on one or more microscopic images, in order thereby to determine a surface property of the sample 3, an expansion/contraction of the sample 3, or the like.

For example, the controller 71 may be configured to compare the measurement result or a variable determined therefrom with a pre-set target value and, on the basis of the result of the comparison, determine whether and optionally to what extent the process gas processing setting 90 should be modified.

With reference to FIG. 1 again, the particle beam system 1 also comprises an output device 87 which is configured to output data, which comprise for example the measurement results of the measuring device 28, managed by the controller 71. By way of example, the output device 87 serves to output measurement results obtained by the measuring device 28 to an operator. By way of example, the output device 87 comprises a display device which displays the data managed by the controller 71. As a result, an operator can look at and analyze the measurement results.

The particle beam system 1 also comprises an input device 88 for receiving an instruction from an operator. By way of example, the input device 88 comprises a mouse, a keyboard, and the like. The instruction received by way of the input device 88 is processed by the controller 71. As a result, the operator (following an analysis of the measurement results output by the output device 87) can for example modify the process gas processing setting 90, for example the process gas supply setting 91 and the process gas activation setting 92.

Figure 4:
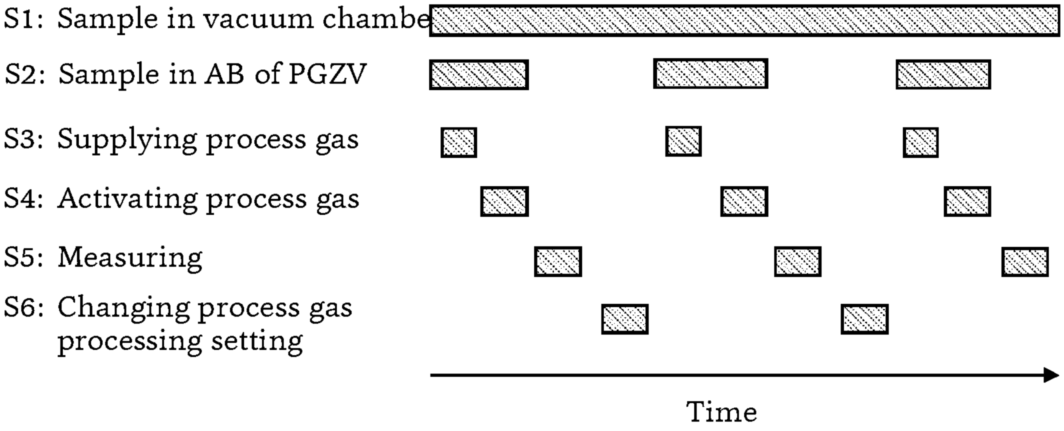
FIG. 4 shows a time profile of method steps of a method for processing a sample.

FIG. 4 shows a time profile of method steps of a method for processing the sample 3. The progress of time is plotted along the horizontal axis. The method steps of the method are specified along the vertical axis. A hatched bar indicates a time interval during which the method step assigned to the respective bar is carried out. Voids between the bars of a method step indicate time intervals during which the method step assigned to the respective bar is not carried out. Bars of different method steps overlapping in time indicate that these method steps are carried out simultaneously during the temporal overlap.

According to the example shown in FIG. 4, the method comprises the following in a first step S1: arranging the sample 3 in the vacuum chamber 49. By way of example, the sample 3 is arranged on the sample holder 5. The bar of step S1 extends over the entire duration of the method, meaning that the sample 3 remains arranged in the vacuum chamber 49 throughout the entire method.

In step S2, the sample 3 is arranged in the work region (AB) of the process gas supply device (PGZV) 61. The bar of step S2 extends over the duration of steps S3 and S4, meaning that the sample 3 remains arranged in the work region of the process gas supply device 61 during the supply and activation of process gas.

If the sample 3 is intended to be activated by the particle beam 12, 15 in step S4, then it is desirable for the work region of the process gas supply device 61 and the first work region 7 to overlap. In this case, the process gas supply device 61 is for example arranged (permanently) in such a way that the work region of the process gas supply device 61 overlaps with the first work region 7. Alternatively, the process gas supply device 61 is moved in such a way that the work region of the process gas supply device 61 overlaps with the first work region 7.

If the sample 3 is intended to be activated by the laser beam 41 in step S4, then it is desirable for the work region of the process gas supply device 61 and the second work region 8 to overlap. In this case, the process gas supply device 61 is for example arranged (permanently) in such a way that the work region of the process gas supply device 61 overlaps with the second work region 8. Alternatively, the process gas supply device 61 is moved in such a way that the work region of the process gas supply device 61 overlaps with the second work region 8.

For example, the sample 3 remains arranged in the first work region 7 or in the second work region 8 throughout the entire duration of the method.

Step S3 is carried out after the sample 3 has been arranged in the work region of the process gas supply device 61. Step S3 comprises the automatic supply of at least one process gas of a plurality of different process gases to the sample 3, arranged in the work region of the process gas supply device 61, by the process gas supply device 61 in accordance with the process gas supply setting 91.

Step S4 is carried out after the end of step S3. Step S4 comprises the activation of the supplied, at least one process gas using a particle beam 12, 15 and/or a laser beam 41. The sample 3 is processed by steps S3 and S4, by virtue of the activated, at least one process gas causing a deposition of material on the sample 3 or a removal of material from the sample 3.

Step S5 is carried out after the end of step S4. Step S5 comprises: measuring a property of the processed sample 3 in the vacuum chamber 49 using a measuring device 28, the property of the sample 3 changing in a manner dependent on the processing of the sample 3. This means that the processing of the sample 3 by steps S3 and S4 is captured quantitatively by the measurement in step S5. The property of the processed sample 3 can be measured at the same location at which the sample 3 was processed using steps S3 and S4. In this case, the sample 3 is not moved following the processing using steps S3 and S4. Alternatively, the sample 3 can be moved to a different location within the vacuum chamber 49 where the measurement is carried out. In this case, step S5 also comprises the movement of the sample 3 to the location within the vacuum chamber 49 where the measurement is carried out.

The process gas processing setting 90 is modified in step S6 on the basis of the measurement result obtained in step S5 by measuring the property, as a result of which the processing process implemented going forward is modified. For example, the process gas supply setting 91 is modified in step S6, as a result of which the supply of the at least one process gas via the process gas supply device 61 is adjusted. Additionally, or in an alternative, the process gas activation setting 92 is modified in step S6, as a result of which the activation of the supplied, at least one process gas is adjusted.

After the end of step S6, the processing of the sample 3 is continued using the modified process gas processing setting 90. Consequently, the modified process gas processing setting 90 has an effect on the processing process carried out at this point. Consequently, the processing is adjusted on the basis of the measured property. In the example of FIG. 4, continuing the processing of the sample 3 means that steps S3 to S6 (and, if desired, S2) are carried out repeatedly. As indicated by the continuous bar of step S1 in FIG. 4, the sample 3 remains in the vacuum chamber 49, for example in the first work region 7 or in the second work region 8, without interruption throughout the duration of steps S2 to S6. Therefore, it is not necessary to remove the sample 3 from the vacuum chamber 49 during the process, enabling quick and low-error sample processing. If both the processing of the sample 3 and the measurement of the property of the sample are carried out at the same location, then it is not necessary to move the sample 3 during the process, further increasing the aforementioned advantages.

As shown by the temporally successively arranged sequences of steps S3 to S6 in FIG. 4, the measurement of the property of the sample in accordance with step S5, the modification of the process gas processing setting 90 in accordance with step S6, and the continuation of the processing with the modified process gas processing setting 90, which is to say steps S3 and S4 (and, if desired, S2), can be carried out repeatedly after step S6 has been carried out. The sample 3 remains arranged in the vacuum chamber 49 in the process.

Figure 5:
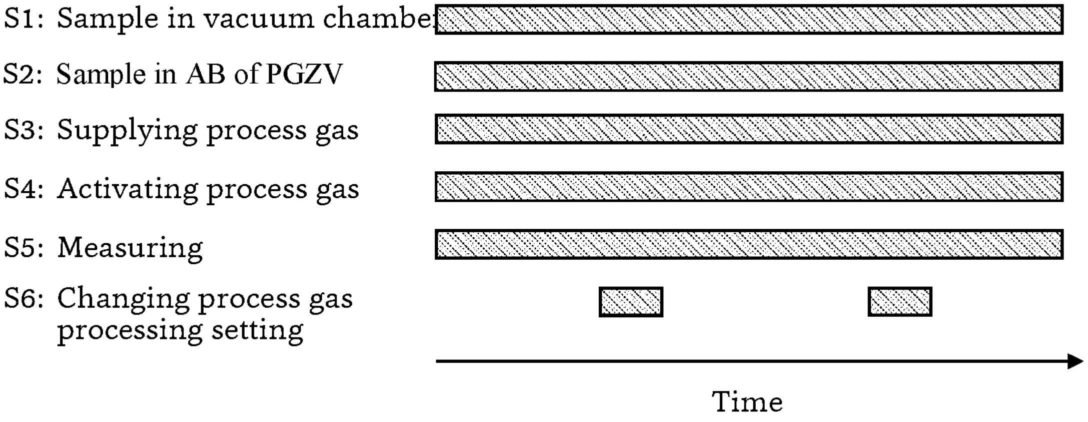
FIG. 5 shows a time profile of method steps of a further method for processing a sample.
Figure 6A:
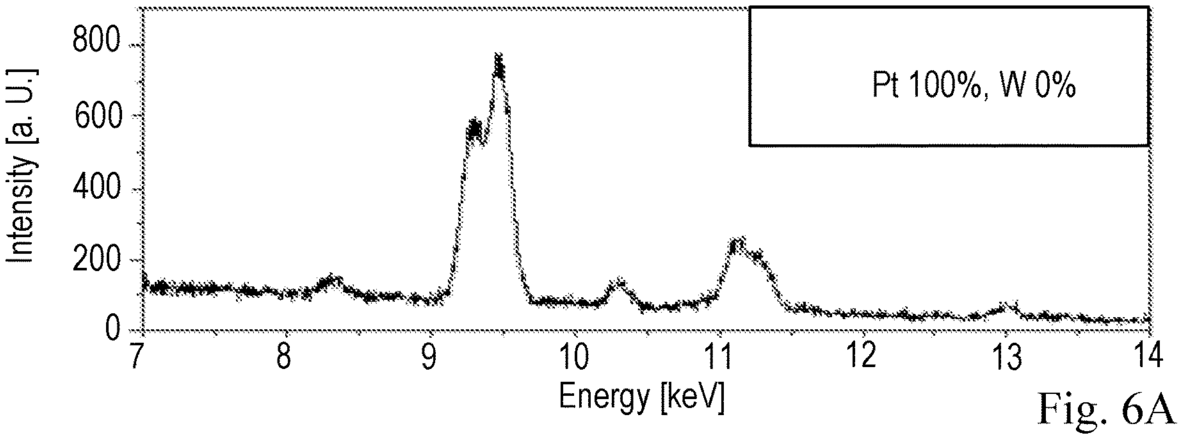
FIGS. 6A-6D show exemplary measurement results of a measuring device of the particle beam system.
Figure 6B:
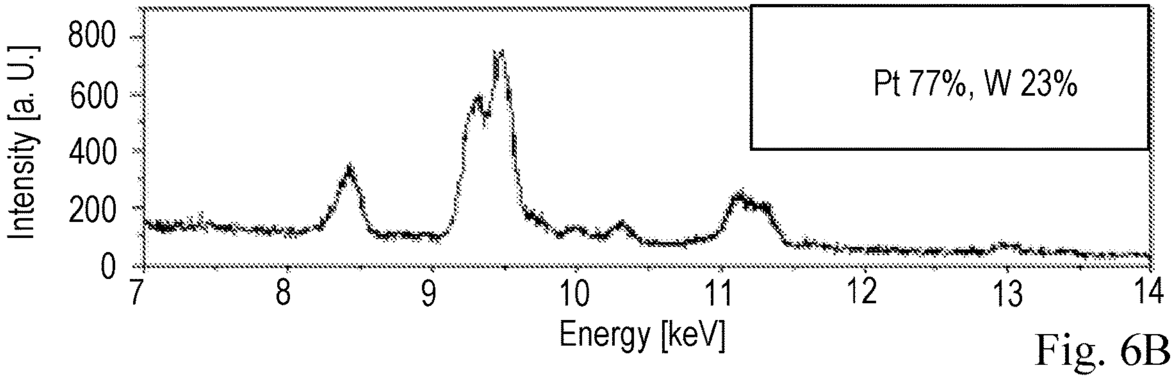
Figure 6C:
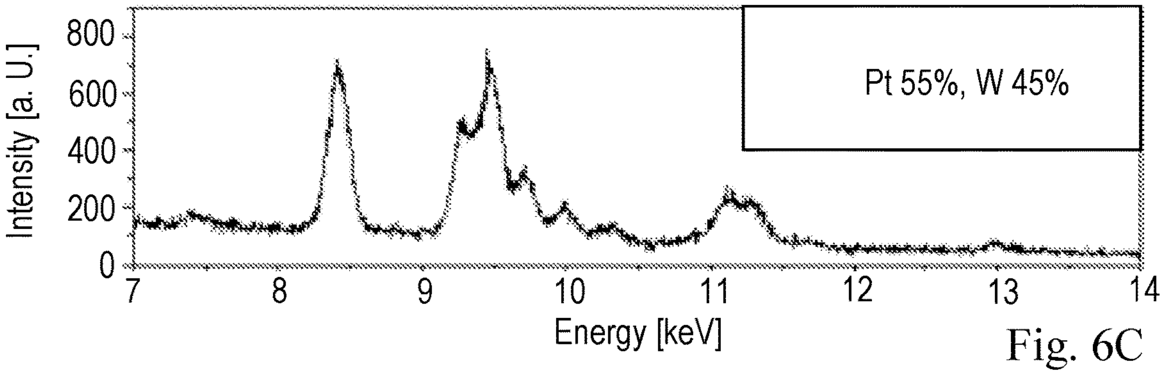
Figure 6D:
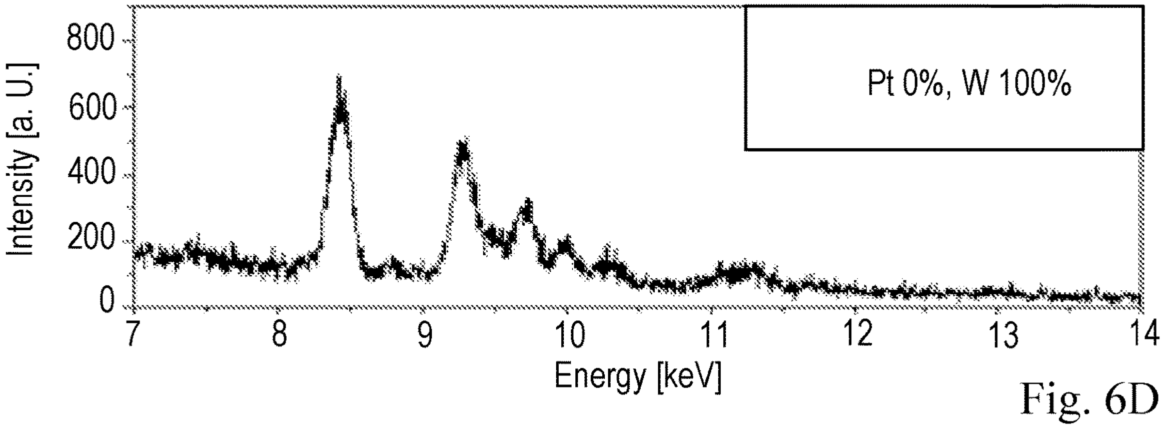

FIG. 5 shows a time profile of method steps of a further method for processing the sample 3. In contrast with the method described in the context of FIG. 4, steps S3 to S5 are carried out continuously (i.e., without interruption) in the method of FIG. 5. Modifying the process gas processing setting 90 in step S6 is carried out occasionally depending on the measurement result of step S5. Hence, the following method arises:

According to step S1, the method comprises the arrangement of the sample 3 in the vacuum chamber 49. The sample remains arranged in the vacuum chamber 49 while the method is carried out.

In step S2, the sample 3 is arranged in the work region of the process gas supply device (PGZV) 61. The bar of step S2 extends over the duration of the entire method, meaning that the sample 3 remains arranged in the work region of the process gas supply device 61 throughout the entire further method.

Steps S3 (automatically supplying at least one process gas of a plurality of different process gases to the sample 3 in the work region of the process gas supply device 61 via the process gas supply device 61 in accordance with the process gas supply setting 91), S4 (activating the supplied, at least one process gas in accordance with the process gas activation setting 92), and S5 (measuring a property of the processed sample 3 using a measuring device 28) are carried out simultaneously without interruption. Modifying the process gas processing setting 90, consequently modifying the process gas supply setting 91 and/or the process gas activation setting 92, is therefore carried out during the processing (i.e., simultaneously with the processing) of the sample 3 by steps S3 and S4. In this way, the processing process is modified, while the processing process is carried out, on the basis of the measurement result obtained in step S5.

Examples and details of step S5 are explained hereinbelow. According to step S5, a property of the processed sample 3 is measured, the property of the sample 3 changing in a manner dependent on the processing of the sample 3. By way of example, the property is a chemical or physical property of the processed sample, for example a chemical or physical property of a deposition on the sample 3 produced by the processing. Herein, a deposition is considered to be a constituent part of the processed sample. In other words, the deposition is a part of the processed sample.

The property measured in step S5 is for example an atomic composition of the processed sample. The atomic composition can be measured via an EDX detector. The atomic composition can be estimated qualitatively on the basis of a detection signal (for example an SEM image) generated by secondary particles or backscattered particles (secondary electrons, backscattered electrons), which can be detected via a detector suitable for detecting charged particles. By way of example, in the case of a mixed deposition of Pt and Si, the Pt component can be determined on the basis of the brightness (intensity) of an SEM image.

The property measured in step S5 is for example an electrical resistance of the processed sample. By way of example, the resistance measurement is implemented using a resistance detector.

The property measured in step S5 is for example a Young's modulus or a flexural modulus of the processed sample. By way of example, the Young's modulus or flexural modulus is measured using a sensing device.

The property measured in step S5 is for example a surface structure of the processed sample, for example a roughness of a surface. To this end, an SEM image of the surface, for example, can be recorded and a roughness of the surface can be determined via an image analysis. Additionally, the surface structure can be determined by cutting the processed sample with the ion beam 15 (or laser beam 41) and measuring the roughness using the electron beam 12 at the cut edge.

The property measured in step S5 is for example an adhesion, a connectivity, or an adhesiveness. For example, these are determined by exerting a mechanical force on the processed sample via a manipulator/sensing device and observing a mechanical change of the processed sample, for example via an image analysis of an SEM image.

The property measured in step S5 is for example a thermal conductivity, which can be measured for example by way of a 3-omega method adapted to a micromanipulator.

The property measured in step S5 is for example a thermal resistivity. The latter can be determined using a heater configured to heat the sample and a manipulator/sensing device. To this end, a force is exerted on the sample via the manipulator/sensing device, in order to obtain a deformation. The deformation occurs above a temperature of the processed sample to be determined, at which temperature the processed sample deforms as a result of the action of force.

The property measured in step S5 is for example a thermal expansion. The latter can be determined by measuring the size of the processed sample as a function of the temperature of the processed sample, which is varied by a heater.

The property measured in step S5 is for example an absorption or emission of electromagnetic radiation. By way of example, the measurement is implemented using a spectroscopic method, for example x-ray spectroscopy, IR spectroscopy, Raman spectroscopy, NMR spectroscopy, and the like.

The property measured in step S5 is for example a chemical reactivity. By way of example, the processed sample can be brought into contact with a reactive substance by way of the process gas supply device 61 and a chemical reaction can be observed, for example via an SEM image.

The property measured in step S5 is for example a density, a magnetization, a melting temperature, a boiling temperature, an optical activity, a viscosity, a surface tension, an acoustic velocity, a deformability, a corrosion resistivity, or a binding energy of the sample produced by the processing.

The measurement result may comprise one or more properties. The measurement may comprise one or more measurements at one or more locations within the vacuum chamber 49.

Details of step S6 are explained hereinbelow. As described above in relation to FIG. 3, the process gas processing setting 90 comprises the process gas supply setting 91, which defines the automatic supply of at least one process gas of the plurality of different process gases to the sample 3 via the process gas supply device 61 (step S3). In this case, modifying the process gas processing setting 90 may comprise: modifying the process gas supply setting 91 on the basis of the measurement result obtained in step S5.

Accordingly, the parameters of the process gas supply are modified on the basis of the measurement result. For example, modifying the process gas supply setting 91 comprises modifying a quantity of the respective process gas to be supplied to the sample 3 (for example by changing the opening duration of a valve which controls the supply of the respective process gas) and/or modifying a supply rate of the respective process gas (volumetric flow) and/or modifying a sequence of the supply of at least two process gases of the plurality of process gases and/or modifying a quantity of the process gases to be supplied to the sample 3 and/or modifying a ratio of the quantities of at least two process gases of the plurality of process gases to be supplied to the sample 3 and/or modifying a mixing ratio of a process gas mixture of at least two process gases of the plurality of process gases, and the like. The component of each of the process gases in the process gas mixture may vary between 0% and 100%.

As described above in relation to FIG. 3, the process gas processing setting 90 may comprise the process gas activation setting 92, which defines the activation of the process gases using the particle beam 12, 15 or the laser beam 40 (step S4). In this case, modifying the process gas processing setting 90 may comprise: modifying the process gas activation setting 92 on the basis of the measurement result obtained in step S5. Accordingly, the parameters of the process gas activation are modified on the basis of the measurement result. By way of example, it is possible to modify the strength of the particle beam 12, 15 or laser beam 41 (for example the current of the particle beam, power of a laser beam), the duration of the activation, and the like.

FIGS. 6A-6D show an example of measurement results which are detected by an EDX detector 31 of the measuring device 28 during a deposition procedure with a process gas mixture made of platinum (Pt) and tungsten (W). A diagram 6A shows an energy-resolved intensity distribution for deposition from a process gas mixture which consists 100% of platinum and 0% of tungsten. A diagram 6B shows an energy-resolved intensity distribution for deposition from a process gas mixture which consists 77% of platinum and 23% of tungsten. A diagram 6C shows an energy-resolved intensity distribution for deposition from a process gas mixture which consists 55% of platinum and 45% of tungsten. A diagram 6D shows an energy-resolved intensity distribution for deposition from a process gas mixture which consists 0% of platinum and 100% of tungsten.

As is evident from the diagrams, the various components of the supplied process gas mixture have peaks of energy values, which are characteristic for the respective component, in the diagrams. In other words, the component can be identified on the basis of the component-specific energy values of peaks in the energy-resolved intensity distribution. Moreover, the level of the respective peaks provides information about the proportion of the respective component in the deposition, with the result that a comparison of the levels of the peaks allows conclusions to be drawn about an actually deposited quantity of the respective component from the process gas mixture. Using such a determination, which may for example be carried out automatically by the controller 71, as a basis, it is possible to automatically adjust the mixing ratio of process gases in a process gas mixture so that a predetermined condition, for example a predetermined quantity or predetermined proportion of a component in a deposition, is satisfied.

Figure 7:
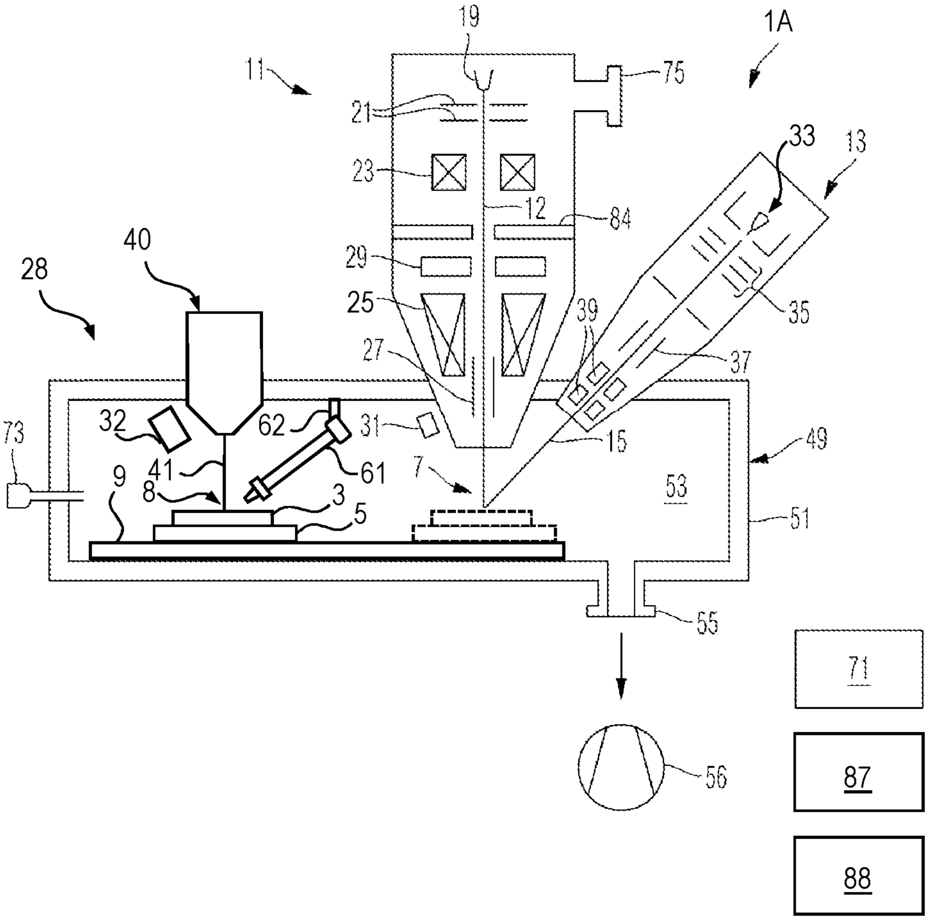
FIG. 7 shows a schematic illustration of a further particle beam system.

FIG. 7 shows a schematic illustration of a further particle beam system 1A for processing a sample 3. The particle beam system 1 differs from the particle beam system 1 shown in FIG. 1 in that the first work region 7, which is to say the work region of the particle beam columns 11 and 13, and the second work region 8, which is to say the work region of the laser 40, do not overlap one another, which is to say are at a distance from one another. Although both the first work region 7 and the second work region 8 are located within the vacuum chamber 49, they may be separated/separable from one another by a lock or the like, with the result that a different vacuum may be generated in the first work region 7 than in the second work region 8.

In comparison with the particle beam system 1, the particle beam system 1A further comprises a transport device 9, which is configured to transport the sample 3 and/or the sample holder 5 between the first work region 7 and the second work region 8. As a result, the sample 3 can be selectively arranged in the first work region 7 or in the second work region 8. In the situation shown in FIG. 7, the sample 3 and the sample holder 5 have been arranged in the second work region 8 by the transport device 9, whereas a dashed representation shows the position of the sample 3 and the sample holder 5 at the first work region 7, which position is adopted if the transport device 9 transports the sample 3 and sample holder 5 into the first work region 7. The controller 71 may be configured to control the transport device 9.

In the situation shown in FIG. 7, the supply of process gas via the process gas supply device 61 (step S3) and the activation of supplied process gas via the laser 40 (step S4) are implemented in the second work region 8.

Just like in the case of the particle beam system 1, the measuring device 28 of the particle beam system 1A is configured to measure a property of the sample 3 in the vacuum chamber 49. Just like in the case of the particle beam system 1, the measuring device 28 of the particle beam system 1A can be configured to measure the property of the sample 3 in the first work region 7, for example by detectors 29 and 31. However, in contrast with the particle beam system 1, the measuring device 28 of the particle beam system 1A may also or alternatively be configured to measure the property of the sample 3 in the second work region 8. By way of example, in the example shown, the particle beam system 1A comprises an additional element 32 from the group of elements (group of different detectors and manipulators). The element 32 operates in the second work region 8. For example, the element 32 is configured to conduct a measurement of a property of the sample 3 in the second work region 8 or to manipulate the sample 3 in the second work region 8. In contrast thereto, the element 31 already described in the context of FIG. 1 operates in the first work region 7. For example, the element 31 is configured to conduct a measurement of a property of the sample 3 in the first work region 7 or to manipulate the sample 3 in the first work region 7.

According to a modification of the particle beam system 1A shown in FIG. 7, the particle beam system 1A may comprise an additional process gas supply device 61 which is configured to operate in the first work region 7. Alternatively, the process gas supply device 61 of the particle beam system 1A shown in FIG. 7 may be configured to optionally operate in the first work region 7 or in the second work region 8. In both of these cases, processing the sample 3 can be carried out by supplying and activating one or more process gases, both in the first work region 7 and in the second work region 8.

What is claimed is:

1. A method of processing a sample in a particle beam system, the particle beam system comprising: a vacuum chamber; a particle beam column configured to produce a particle beam of charged particles and to direct the particle beam of charged particles to a first work region within the vacuum chamber; a measuring device comprising a detector configured to detect electrically charged particles emanating from the first work region; a process gas supply device configured to guide a plurality of different process gases to the first work region in accordance with a process gas supply setting; and a controller configured to control the particle beam column and the process gas supply device and to receive and process a detection signal from the detector, the method comprising:

processing the sample in the first work region by automatically supplying to the sample, in accordance with the process gas supply setting, at least one process gas of the process gases via the process gas supply device and by an activation by the particle beam in accordance with a process gas activation setting of the at least one process gas;

measuring a property of the processed sample in the vacuum chamber using the measuring device, the property of the sample changing in a manner dependent on the processing of the sample;

modifying the process gas supply setting so that there is a change in a ratio of the quantities of the process gases to be supplied, based on a measurement result obtained by the measurement; and continuing the processing of the sample in the first work region using the modified process gas supply setting.

2. The method of claim 1, wherein the sample is arranged in the first work region while the property of the processed sample is measured.

3. The method of claim 1, wherein the process gas supply setting is modified while the sample is processed.

4. The method of claim 1, further comprising repeatedly measuring the property of the sample, modifying the process gas supply setting, and continuing the processing of the sample.

5. The method of claim 1, wherein the sample remains arranged in the vacuum chamber while the method is carried out.

6. The method of claim 1, wherein the automatic supply in accordance with the process gas supply setting of the at least one process gas of the process gases comprises:

producing a process gas mixture of at least two different process gases of the process gases in the process gas supply device in accordance with a mixing ratio defined by the process gas supply setting;

supplying the produced process gas mixture to the sample; and modifying the process gas supply setting so that the mixing ratio changes.

7. The method of claim 1, wherein modifying of the process gas supply setting comprises modifying a sequence of the supply of at least two different process gases of the process gases.

8. The method of claim 1, wherein the method further comprises modifying the process gas activation setting on the basis of the measurement result.

9. The method of claim 1, wherein the property of the processed sample is a chemical or physical property of the processed sample.

10. The method of claim 1, wherein the property of the processed sample comprises at least member selected from the group consisting of an atomic composition, an electrical resistance, a Young's modulus, a flexural modulus, a surface structure, an adhesion, a thermal conductivity, a thermal resistivity, a thermal expansion, an absorption of electromagnetic radiation, an emission of electromagnetic radiation, a reactivity, a density, a magnetization, a melting temperature, a boiling temperature, an optical activity, a viscosity, a surface tension, an acoustic velocity, a deformability, a corrosion resistivity, a binding energy, an optical reflectivity, an optical transmissivity, an optical absorption, a mass spectrum, and a mass-to-charge ratio spectrum.

11. The method of claim 1, wherein the measuring device at least one member selected from the group consisting of:

an EDX detector configured to measure x-ray radiation energy dispersively;

a sensing device configured to exert a force on the sample and to measure the exerted force;

a heater configured to heat the sample;

a spectrometer for electromagnetic radiation;

a light source configured to expose the sample;

a light detector configured to detect light emanating from the sample; and a mass spectrometer configured to resolve matter emanating from the sample according to mass and/or according to a mass-to-charge ratio.

12. The method of claim 1, wherein the controller is configured to automatically perform the processing of the sample, the measuring of the property of the sample, and/or the modifying of the process gas supply setting.

13. The method of claim 1, wherein one of the following holds:

the particle beam column is an electron beam column and the particle beam is an electron beam; or the particle beam column is an ion beam column and the particle beam is an ion beam.

14. The method of claim 1, wherein the activation of the supplied, at least one process gas causes material from the process gases to be deposited on the sample.

15. The method of claim 1, wherein the activation of the supplied, at least one process gas causes material to be removed from the sample.

16. One or more machine-readable hardware storage devices comprising instructions that are executable by one or more processing devices to perform operations comprising the method of claim 1.

17. A system, comprising:

one or more processing devices; and one or more machine-readable hardware storage devices comprising instructions that are executable by the one or more processing devices to perform operations comprising the method of claim 1.

18. A method of processing a sample in a particle beam system, the particle beam system comprising: a vacuum chamber; a particle beam column configured to produce a particle beam of charged particles and direct the particle beam of charged particles to a first work region within the vacuum chamber; a measuring device which comprises a detector, the detector configured to detect electrically charged particles emanating from the first work region; a laser configured to produce a laser beam and to direct the laser beam to a second work region within the vacuum chamber; a process gas supply device configured to guide a plurality of different process gases to the second work region in accordance with a process gas supply setting; and a controller configured to control the particle beam column, the laser, and the process gas supply device and to receive and process a detection signal from the first detector, the method comprising:

processing the sample in the first work region by supplying to the sample, in accordance with the process gas supply setting, at least one process gas of the process gases via the process gas supply device and by an activation by the laser beam in accordance with a process gas activation setting of the at least one process gas;

measuring a property of the processed sample in the vacuum chamber using the measuring device, the property of the sample changing in a manner dependent on the processing of the sample;

modifying the process gas supply setting so that there is a change in a ratio of the quantities of the process gases to be supplied, based on a measurement result obtained by the measurement; and continuing the processing of the sample in the second work region using the modified process gas supply setting.

19. A particle beam system configured to process a sample, the particle beam system comprising:

a vacuum chamber;

a particle beam column configured to produce a particle beam of charged particles and to direct the particle beam of charged particles to a first work region within the vacuum chamber;

a measuring device comprising at detector configured to detect electrically charged particles emanating from the first work region;

a process gas supply device configured to guide a plurality of different process gases to the first work region in accordance with a process gas supply setting; and a controller configured to control:

the particle beam column and the process gas supply device and to receive and process a detection signal from the detector, the process gas supply device in accordance with the process gas supply setting so that at least one process gas of the plurality of different process gases is supplied to the sample in the first work region via the process gas supply device;

the particle beam column in accordance with a process gas activation setting so that the at least one process gas supplied to the sample is activated by the particle beam to process the sample in the first work region, wherein:

the measuring device is configured to measure a property of the sample in the vacuum chamber, the property of the sample changing in a manner dependent on the processing of the sample; and the controller is configured to:

modify the process gas supply setting so that a ratio of the quantities of the process gases to be supplied changes; and process the sample in the first work region in accordance with the modified process gas supply setting.

20. A particle beam system configured to process a sample, the particle beam system comprising:

a vacuum chamber;

a particle beam column configured to produce a particle beam of charged particles and direct the particle beam of charged particles to a first work region within the vacuum chamber;

a measuring device comprising a detector configured to detect electrically charged particles emanating from the first work region;

a laser configured to produce a laser beam and direct the laser beam to a second work region within the vacuum chamber;

a process gas supply device configured to guide a plurality of different process gases to the second work region in accordance with a process gas supply setting;

a controller configured to control:

the particle beam column, the laser, and the process gas supply device and to receive and process a detection signal from the first detector;

the process gas supply device in accordance with the process gas supply setting so that at least one process gas of the plurality of different process gases is supplied to the sample in the second work region via the process gas supply device; and the laser in accordance with a process gas activation setting so that the at least one process gas supplied to the sample is activated by the laser beam to process the sample in the second work region, wherein:

the measuring device is configured to measure a property of the sample in the vacuum chamber, the property of the sample changing in a manner dependent on the processing of the sample; and the controller is configured to:

modify the process gas supply setting so that a ratio of the quantities of the process gases to be supplied changes; and process the sample in the second work region in accordance with the modified process gas supply setting.

* * * * *